(12) United States Patent
Ahmed et al.

(10) Patent No.: US 11,177,243 B2
(45) Date of Patent: Nov. 16, 2021

(54) MICRO LIGHT-EMITTING DIODE DISPLAY FABRICATION AND ASSEMBLY

(71) Applicant: Intel Corporation, Santa Clara, CA (US)

(72) Inventors: Khaled Ahmed, Hillsboro, OR (US); Anup Pancholi, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 726 days.

(21) Appl. No.: 15/933,163

(22) Filed: Mar. 22, 2018

(65) Prior Publication Data

US 2019/0295992 A1 Sep. 26, 2019

(51) Int. Cl.

| | |
|---|---|
| *H01L 25/075* | (2006.01) |
| *H01L 33/62* | (2010.01) |
| *H01L 33/24* | (2010.01) |
| *H01L 33/32* | (2010.01) |
| *H01L 33/00* | (2010.01) |
| *H01L 25/16* | (2006.01) |
| *H01L 33/06* | (2010.01) |

(52) U.S. Cl.
CPC ........ *H01L 25/0753* (2013.01); *H01L 25/167* (2013.01); *H01L 33/007* (2013.01); *H01L 33/0025* (2013.01); *H01L 33/0093* (2020.05); *H01L 33/24* (2013.01); *H01L 33/32* (2013.01); *H01L 33/62* (2013.01); *H01L 33/06* (2013.01); *H01L 2933/0066* (2013.01)

(58) Field of Classification Search
CPC ......... H01L 33/0093; H01L 2021/6006–6009; H01L 21/6835–6836; H01L 51/003; H01L 2224/81894–81895

See application file for complete search history.

(56) References Cited

U.S. PATENT DOCUMENTS

2011/0121264 A1† 5/2011 Choi et al.

FOREIGN PATENT DOCUMENTS

| WO | 2013/104723 | † | 7/2013 |
|---|---|---|---|
| WO | 2017/009394 | † | 1/2017 |

† cited by third party

*Primary Examiner* — Amar Movva
(74) *Attorney, Agent, or Firm* — Schwabe, Williamson & Wyatt, P.C.

(57) ABSTRACT

Micro light-emitting diode (LED) display fabrication and assembly are described. In an example, a micro-light emitting diode (LED) display panel includes a display backplane substrate having a plurality of metal bumps thereon. A plurality of LED pixel elements includes ones of LED pixel elements bonded to corresponding ones of the plurality of metal bumps of display backplane substrate. One or more of the plurality of LED pixel elements has a graphene layer thereon. The graphene layer is on a side of the one or more of the plurality of LED pixel elements opposite the side of the metal bumps.

21 Claims, 14 Drawing Sheets

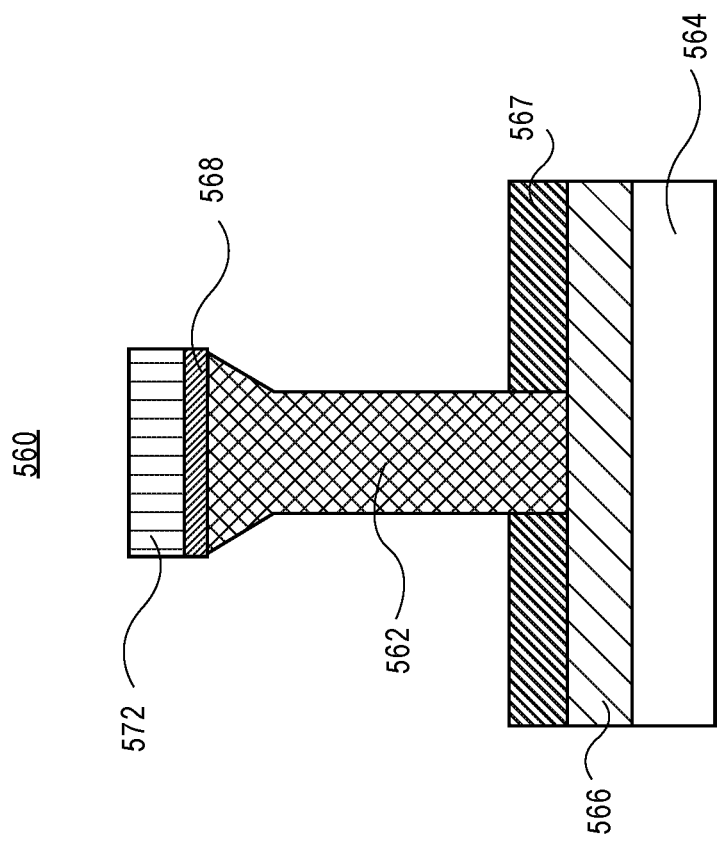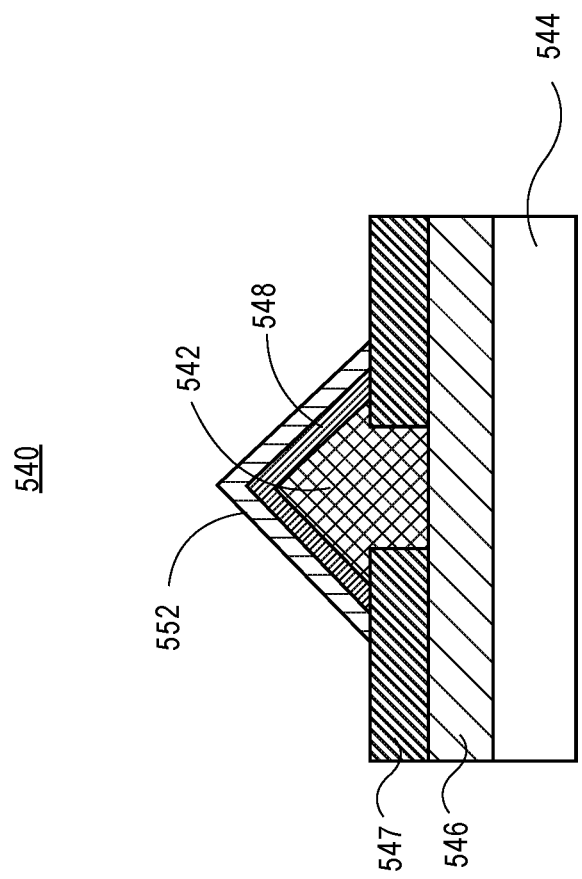

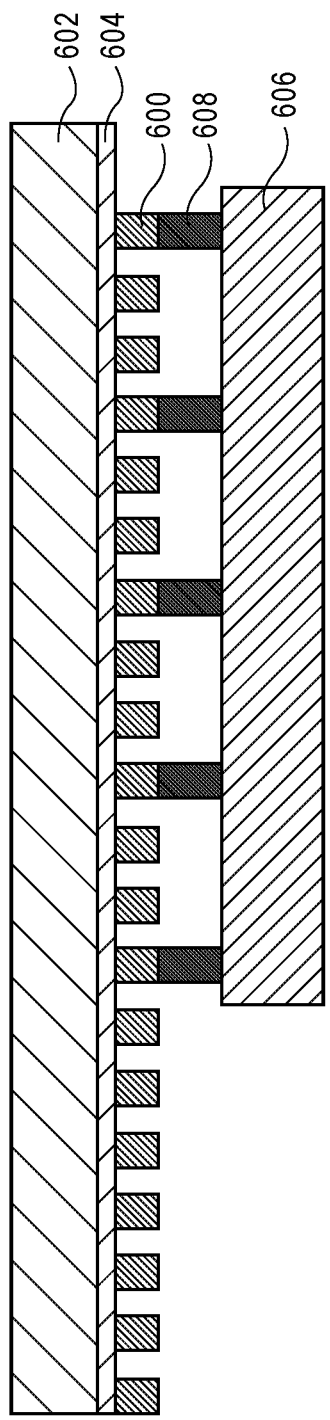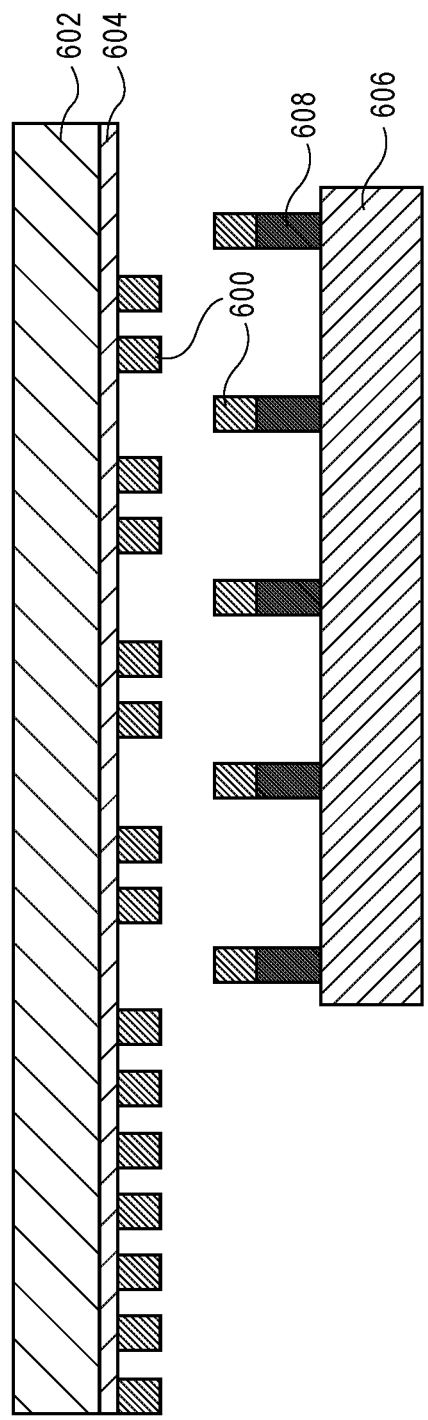

FIG. 6D(2)

MICRO LIGHT-EMITTING DIODE DISPLAY FABRICATION AND ASSEMBLY

TECHNICAL FIELD

Embodiments of the disclosure are in the field of micro-LED displays.

BACKGROUND

Displays having micro-scale light-emitting diodes (LEDs) are known as micro-LED, mLED, and µLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIG. 5C illustrates a cross-sectional view of a GaN nanopyramid or micropyramid based LED highlighting certain layers of the LED, in accordance with an embodiment of the present disclosure.

FIG. 5D illustrates a cross-sectional view of a GaN axial nanowire based LED highlighting certain layers of the LED, in accordance with an embodiment of the present disclosure.

DESCRIPTION OF THE EMBODIMENTS

Figure 1:
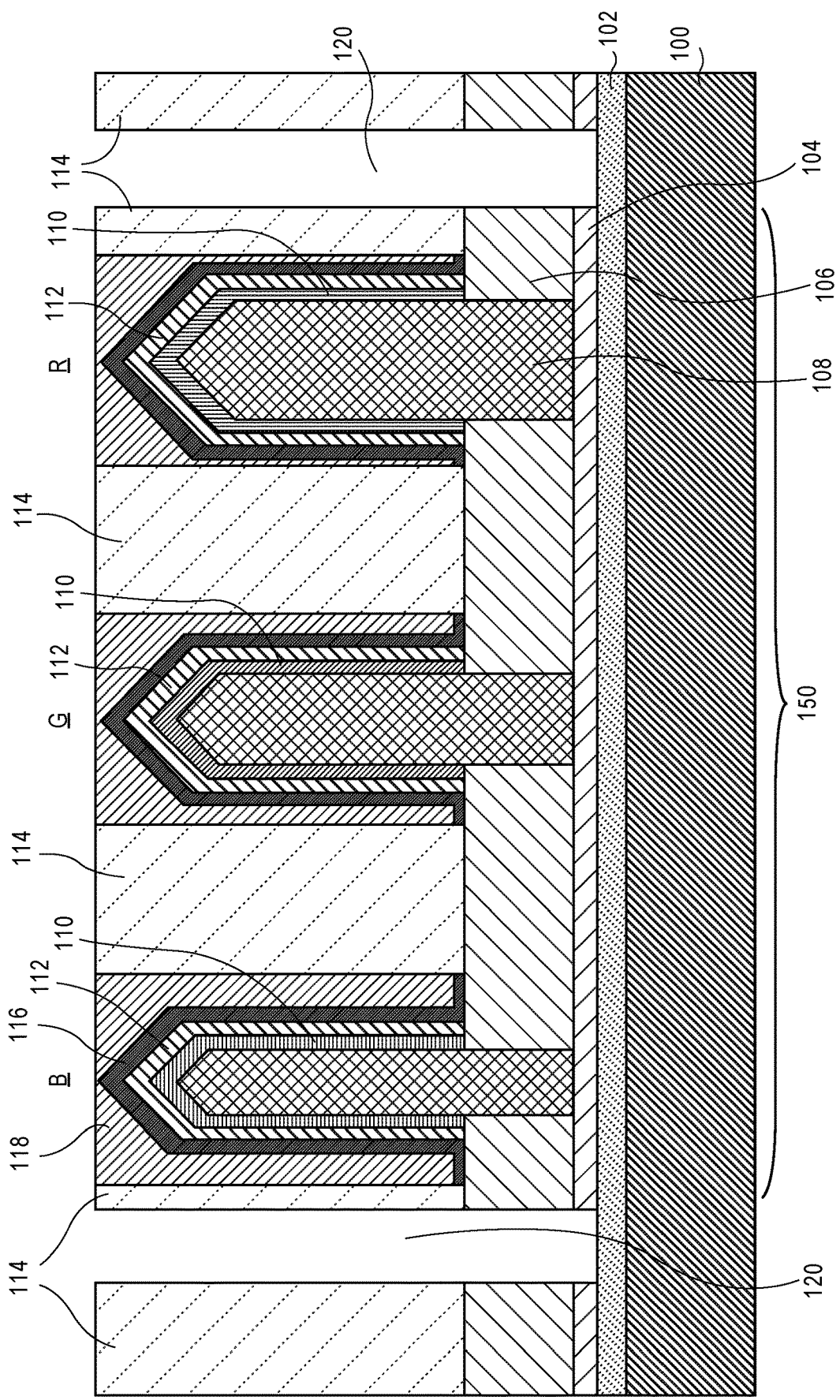
FIG. 1 illustrates a cross-sectional view of a red-green-blue chip (an RGB chip) with three nanowire LEDs, in accordance with an embodiment of the present disclosure.

Micro light-emitting diode (LED) display, its fabrication and assembly are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and methods for micro LED assembly. In an embodiment, a device and method for fabricating full-color micro light emitting diode (µLED) displays by micro transfer assembly. Micro LED displays promise 3x-5x less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

To provide further context, displays based on inorganic micro LEDs (µLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured. The target acceptable defect density after such a transfer is approximately 1-2 ppm. This low defect density requirement may be achieved by transferring two micro LEDs for each color (red, green and blue), a so-called "redundancy strategy." However, transferring more micro LEDs for redundancy may result in higher manufacturing cost.

In accordance with an embodiment of the present disclosure, addressing both cost and defectivity requirements, monolithic red, green and blue pixels are manufactured on a wafer and then transferred, as opposed to transferring individual micro LEDs with different colors from three separate source wafers sequentially. As described herein, source wafers are fabricated having individual red green blue (RGB) pixels (chips) thereon. Wafer-to-wafer bonding equipment and process technologies are then implemented to transfer micro LEDs from a source wafer to a target display backplane substrate, either directly or through an intermediate carrier plate. Thus, it is to be appreciated that typically three colors are transferred at the same time. It is not necessarily the case that "one RGB pixel" is transferred. Rather, it may be the case that one "whole" pixel is transferred. In another case, red, green, and blue micro LEDs are spaced appropriately on the wafer such that when they are transferred to the display backplane, they will land on pre-designated contact pads that may be separated by half of the pixel pitch or one quarter of the pixel pitch or other similar large enough spacing to prevent color bleeding.

To provide further context, a state-of-the-art approach involves transfer with a stamp. For example, a stamp picks from the source wafer and the transfers to a target substrate where micro LED devices are assembled with driving electronics to provide a display. The approach, however, requires the need for pick up, bond, and release mechanisms. The approach is typically slow and expensive, and requires unique tooling.

In a first aspect, in accordance with an embodiment of the present disclosure, direct transfer from source to target is used to fabricate micro LED displays. Micro LED devices are fabricated on a source wafer and then transferred directly to a target display backplane where the micro LED devices are assembled with driving electronics to provide a display. In an embodiment, the release of the micro LEDs that are grown and attached to a silicon wafer is performed using "selective laser release." The selectivity at small pitch (e.g., less than 2 micron) is accomplished by using device structure including a thermal isolation layer (e.g., dielectric) between adjacent micro LEDs. In a particular embodiment, when one micro LED is released by ablating (via laser irradiation) of the "release layer," the adjacent micro LED are not to be impacted. By implementing thermal isolation, impact to neighboring micro-LEDs will be eliminated and will not be inadvertently released. A release layer located underneath only the desired micro-LED for transfer is ablated and the integrity of neighboring dies remains intact for a next transfer. Implementing such an approach may be advantageous by improving transfer yield significantly, which reduces cost of manufacturing. FIG. 1 illustrates a cross-sectional view of a red green blue chip (an RGB chip) with three nanowire LEDs, in accordance with an embodiment of the present disclosure. Referring to FIG. 1, although shown as three different color micro-LEDs across (e.g., blue, green, red from left-right), the three are shown in this manner for illustrative purposes only. It is to be appreciated that for a pixel such as a 2×2 pixel element, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 1. In another embodiment, four micro LEDs are arranged a 2×2 arrangement. In another embodiment, nine micro LEDs are arranged a 3×3 arrangement (three red micro LEDs, three green micro LEDs, and three blue micro LEDs), etc It is to be appreciated that a micro LED is composed of an array of nanowire LEDs. The number of nanowire LEDs per one micro LEDs is at least one. For example, a 10 um×10 um micro LED may be composed of 90 nanowire LEDs connected in parallel to emit light of a specific color. It is further to be appreciated that, with respect to FIG. 1, the micro LEDs are represented by one nanowire each for illustrative purposes. This in general is not the case. Typically, one micro LED will be composed of more than one nanowire LED. Also, in FIG. 1, one example arrangement is shown. That is, the three colors are adjacent to each other. However, in some cases, the micro LEDs of different colors are separated on the source wafer by a distance that may be half of the display pixel pitch, for example.

With reference again to FIG. 1, in a particular embodiment, a source micro LED wafer 100 (such as a silicon wafer) has "RGB Chips" monolithically grown thereon. The silicon wafer 100 is first coated with an aluminum nitride (AlN) buffer layer 102, e.g., having a thickness of approximately 50 nanometers. The AlN buffer layer 102 may have a bandgap of about 6 eV and may be transparent to infrared radiation. A metal-based nucleation layer (MNL) 104 is then deposited on the AlN buffer layer 102. The MNL 104 may have a thickness in the range of 30-100 nm and may be crystalline or polycrystalline. A silicon nitride mask 106 is then deposited on the MNL. Lithography may then be used to open apertures in the silicon nitride mask 106 mask with diameters carefully chosen to accommodate the subsequent formation of LEDs that emit red, green, and blue colors. N-type GaN nanowire cores are then grown, e.g., by metal organic chemical vapor deposition (MOCVD), as seeded from the MNL 104. The nanowire cores may have diameters in the range 50 nm to 250 nm.

Referring again to FIG. 1, indium gallium nitride (InGaN) shells 110 are grown around the GaN cores 108, e.g., using MOCVD. The amount of indium in the InGaN shells 110 depends on the GaN core diameter. In an embodiment, smaller core diameter result in the growth of InGaN shells with smaller indium content. Larger core diameters result in the growth of InGaN shells with larger indium content. For blue (B) color emission, the indium content is approximately 20%. For green (G) color emission, the indium content is approximately 30%. For red (R) color emission, the indium content is approximately 40%. A p-type GaN cladding layer 112 may then be formed around the InGaN shells 110, e.g., using MOCVD. The core-shell nanowires are the covered by an insulating material layer 114, e.g., a silicon oxide (SiOx) layer. A lithography and etch may then be used to expose the p-GaN cladding layers 112 for all color core-shell nanowire structures. Atomic layer deposition may then be used to conformally deposit a metal layer 116 on the p-GaN cladding layers 112. A metal fill process may then be performed to fill in contact metals 118 for the micro LED structures.

Referring more generally to FIG. 1 a semiconductor structure includes a silicon wafer 100 and plurality of pixel elements 150. Each of the pixel elements 150 includes a first color nanowire LED, a second color nanowire LED (the second color different than the first color), and a pair of third color nanowire LEDs (the third color different than the first and second colors). A continuous insulating material layer 114 is laterally surrounding the first color nanowire LED, the second color nanowire LED, and the pair of third color nanowire LEDs. Adjacent pixel elements are separated from one another by a trench 120 between corresponding continuous insulating material layers 114. It is to be appreciated that more than three colors may be fabricated. For example, structures may be fabricated for red, green, yellow or blue emission. In another example, structures may be fabricated for red, orange, green, or blue emission.

In an embodiment, for each of the pixel elements 150, the first color is red, the second color is green, and the third color is blue. In another embodiment, for each of the pixel elements 150, the first color is red, the second color is blue, and the third color is green. In another embodiment, for each of the pixel elements 150, the first color is blue, the second color is green, and the third color is red. In an embodiment, for each of the pixel elements 150, the first color nanowire LED, the second color nanowire LED, and the pair of third color nanowire LEDs have a 2×2 arrangement. In another embodiment, a structure referred to as "monolithic blue and green only" may be fabricated. In such a case, three times as many blue micro LEDs as the green micro LEDs are fabricated. Then, after transfer of the blue and greed micro LEDs to the display backplane (at one shot of transfer), quantum dots are added on some of the blue micro LEDs to convert that blue to red color.

In an embodiment, upon fabrication of a micro-LED wafer, in order to fabricate a micro-LED based display, a direct transfer method is used in which micro-LEDs from source wafers are bonded with a target display backplane with the assistance of precise alignment, thermal compression bonding and selective release using IR source by means of selectively ablating the MNL in the source wafer.

In an exemplary direct transfer method (DTM) approach for transferring micro LED pixels from a silicon wafer to a display backplane, FIGS. 2A-2D illustrate cross-sectional views of a method of transferring pixel elements or RGB chips from a silicon wafer to a display backplane, in accordance with an embodiment of the present disclosure. It is to be appreciated that, as contemplated for embodiments described herein, typically, a prularity of micro LEDs with different colors that have been grown on a single wafer monolithically is transferred to the display backplane. The scope is thus not limited to transferring "RGB chips".

Figure 2A:
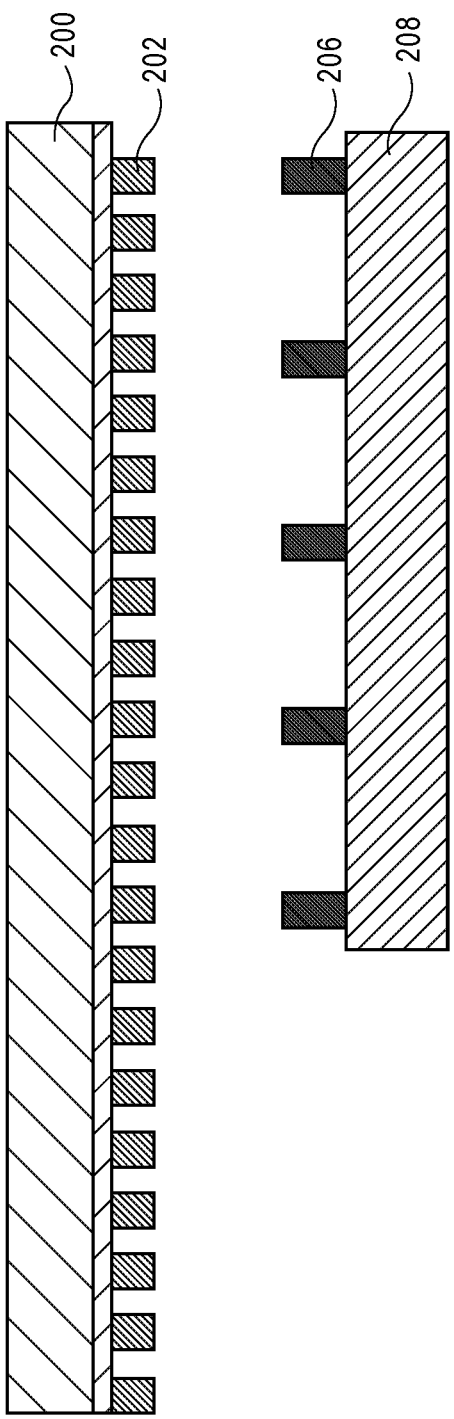
FIGS. 2A-2D illustrate cross-sectional views of a method of transferring pixel elements or RGB chips from a silicon wafer to a display backplane, in accordance with an embodiment of the present disclosure.
Figure 2B:
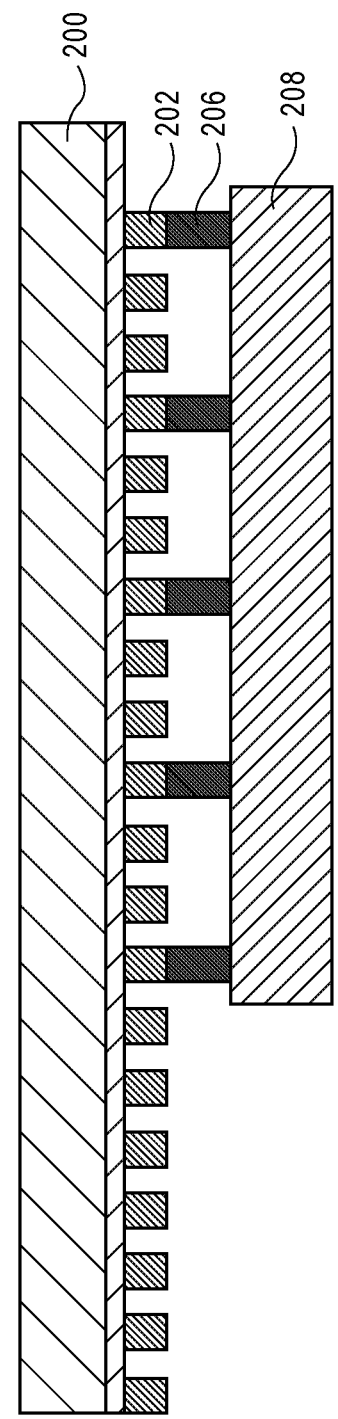
Figure 2C:
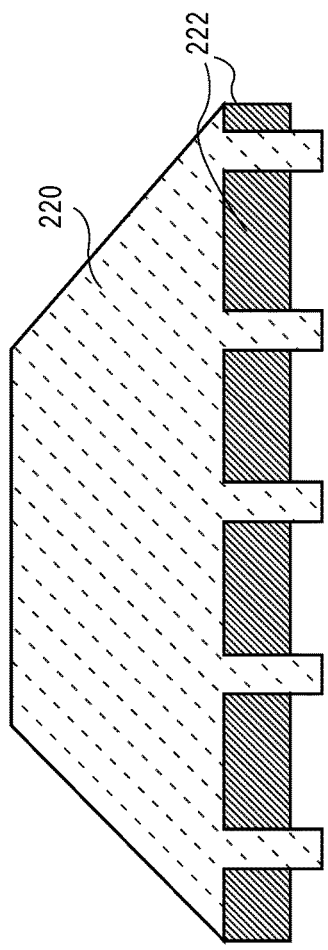
Figure 2C:
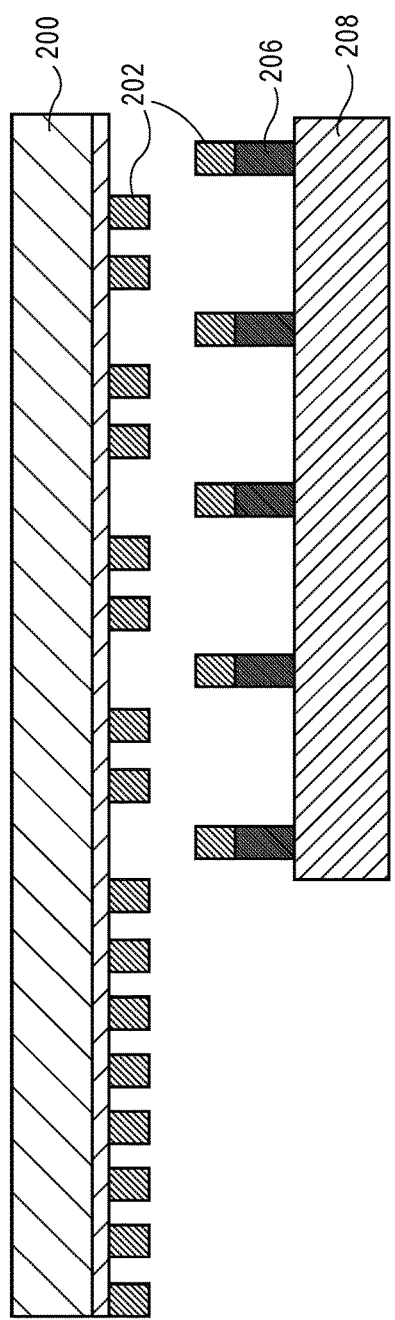
Figure 2D:
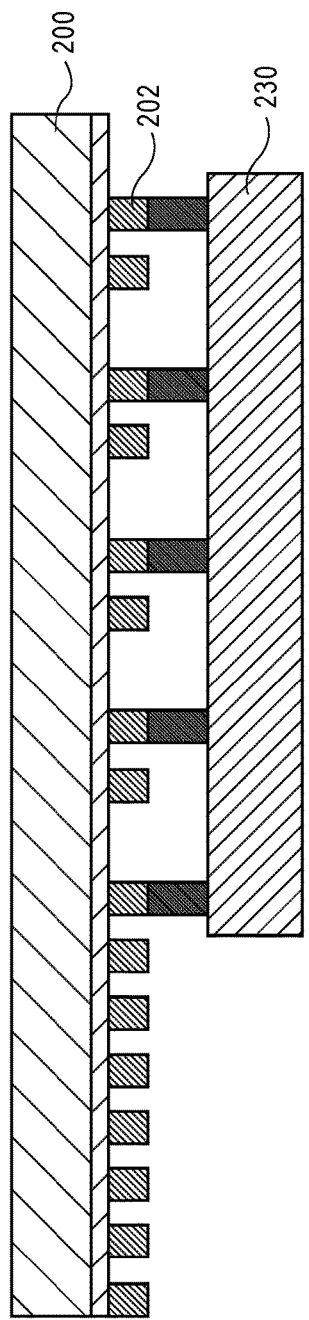

Referring to FIG. 2A, a silicon wafer 200 having micro LED pixel elements 202 thereon is aligned with metal bumps 206 of a backplane 208, such as a display thin film transistor (TFT) backplane. Thermal compression bonding is then performed for aligned micro LED pixel elements 202 and metal bumps 206, as is depicted in FIG. 2B. In one embodiment, the thermal compression bonding is performed at a temperature in the range of 25° C. to 430° C., and at a pressure in the range of 1-2 MPa. Referring to FIG. 2C, the bonded micro LED pixel elements 202 are detached from the silicon wafer 200 using IR light 220 passed through a mask 222 that is aligned with metal bumps 206 of the backplane 208. In an embodiment, referring to FIG. 2D, the remaining micro LED pixel elements 202 are aligned to a new display backplane 230.

In an embodiment, the above described direct transfer method is performed using a modified wafer-to-wafer bonding equipment and process technologies to directly transfer micro LEDs from source wafer to target display backplane substrate. In a specific embodiment of the approach described above, a source wafer is aligned in close proximity to a target substrate in a bonder tool (FIG. 2A). Thermocompression bonding (TCB) is then used to bond micro LEDs to metal pad bumps on the target substrate (FIG. 2B). After bonding of micro LED RGB chips or micro LEDs with various colores, as described above, from the silicon source wafer to first target display substrate, micro LED RGB chips are detached (de-bonded) from the source wafer using infrared (IR) radiation through the silicon wafer (FIG. 2C). A second target display substrate is brought in close proximity of the silicon source wafer but with a misalignment that is equivalent to the RGB chip pitch on the source wafer in order to pick new RGB chips from source wafer to second target display substrate (FIG. 2D. The alignment may be performed using infrared imaging, optical, or mechanical approaches common to wafer-to-wafer bonders.

In an embodiment, the above described IR laser ablates a conductive layer used as a nucleation layer to grow nanowire LEDs, such as metal-based nucleation layer (MNL) 104 of FIG. 1. The conductive nucleation layer may serve as a release layer that can be substantially or completely ablated (vaporized) using IR radiation to de-bond the device from the substrate. In this approach, however, the selective release is primarily dependent on either the IR source position, beam diameter and positioning control of both source and target substrates. Accordingly, an approach based on irradiation of a conductive nucleation layer may be associated with risk of releasing unwarranted neighboring micro-LEDs due to thermal energy spread.

In accordance with another embodiment of the present disclosure, a thermal isolation material, such as silicon dioxide, silicon nitride, aluminum oxide, or similar materials, is patterned in between the micro-LEDs. Upon IR laser ablation of targeted ablation material, the thermal isolation barrier prevents heat dissipation to the ablation layer on the neighboring dies and hence prevents unwarranted release.

Figure 3:
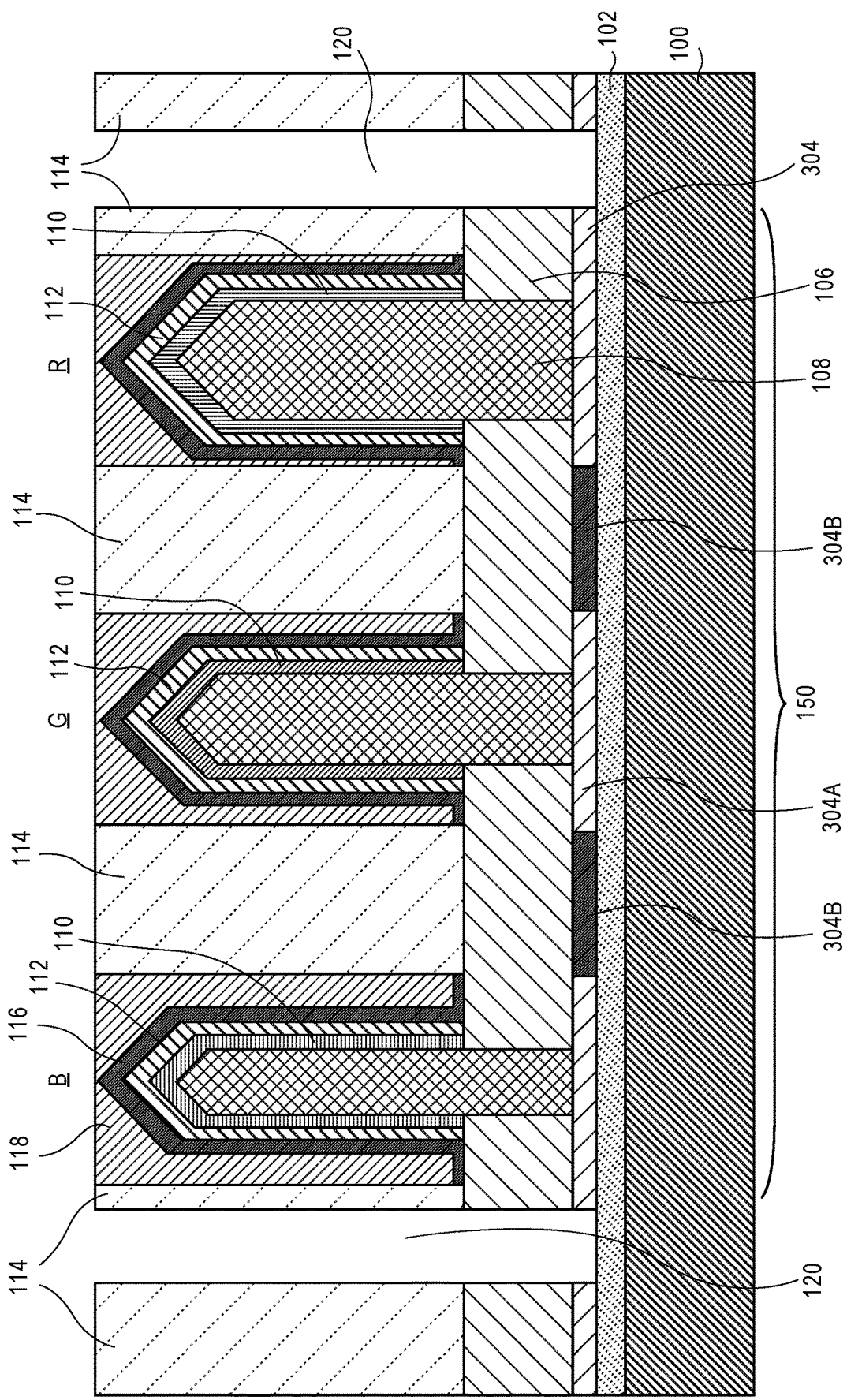
FIG. 3 illustrates a cross-sectional view of a red-green-blue chip (an RGB chip) with three nanowire LEDs, in accordance with another embodiment of the present disclosure.

FIG. 3 illustrates a cross-sectional view of a red green blue chip (an RGB chip) with three nanowire LEDs, in accordance with another embodiment of the present disclosure.

Referring to FIG. 3, like numerals described in association with FIG. 1 may be the same or similar in FIG. 1. In FIG. 3, however, in place of metal-based nucleation layer (MNL) 104, a patterned nucleation layer 304 is included between the source micro LED wafer 100 and the core-shell nanowire LEDs (B), (G) and (R). In one such embodiment, patterned nucleation layer 304 includes regions 304A of metal-based nucleation layer (MNL) material with intervening regions 304B of thermal isolation material, such as a dielectric material. In an embodiment, the intervening regions 304B of thermal isolation material are formed by patterning either a dielectric material or a metal nucleation material, and then filling the pattern with the other of the dielectric material or the metal nucleation material, following by planarization.

In a second aspect, in accordance with an embodiment of the present disclosure, systems and methods for gallium nitride growth on 300 mm silicon (001) wafers are described.

To provide context, as a result of the crystalline symmetry, GaN epitaxy is typically carried out on (111) Si substrates. On the other hand, GaN light emitting diodes are manufactured today on 6" diameter Sapphire wafers which is expensive for making GaN LED devices for display applications, and is not compatible with integration of CMOS devices and RF GaN devices. However, the use of large area, low cost (001) Si offers the possibility of seamlessly integrating Si electronics and processing technology with GaN-based devices.

Embodiments described herein involve material growth and processing technologies to enable the fabrication of high crystalline quality, crack-free GaN epitaxial layers on (001) Si substrates with conductive buffer layers that enable realization of true vertical GaN-on-Si devices. Embodiments may be implemented to realize micro LEDs (μLEDs) and nanowire LEDs (nLEDs) that, for example, can be used in displays including in cellular phone displays, tablets, etc. Embodiments may also be implemented to realize high performance RF devices based on GaN material system.

To provide further context, major factors driving the growth of the GaN semiconductor device industry include the vast addressable market for GaN in consumer electronics and automotive, wide bandgap property of GaN material encouraging innovative applications, success of GaN in RF power electronics, and increasing adoption of GaN RF semiconductor device in military, defense and aerospace applications. GaN LEDs are widely used in laptop and notebook display, mobile display, projectors, televisions and monitor, signs and large displays, etc. The market for GaN-based power drives is expected to grow significantly during the forecast period attributed to its superior features such as minimum power loss, high-speed switching miniaturization, and high breakdown voltage as compared with the silicon-based power devices.

In accordance with one or more embodiments of the present disclosure, graphene is formed on (001) Si and is used as a template layer for GaN epitaxy. In an particular embodiment, functionalization of graphene is performed using hydrazine treatments of a graphene surface at relatively low temperature to enhance the interaction between GaN and graphene and to promote a low resistance interface for device operation. In an embodiment, a graphene layer is ablated by using a femtosecond laser (infrared) through the Si wafer to separate LED devices from the Si wafer so they can be assembled on glass or plastic display backplanes to make micro LED displays.

Advantages of implementing embodiments described herein may include, but are not limited to, providing a path for low cost micro LED displays, providing a path for low cost integration of GaN RF devices and CMOS devices on a same substrate. Furthermore, the use of hydrazine to functionalize graphene prior to GaN growth can provide a low temperature solution (e.g., as opposed to using ammonia). In an embodiment, graphene is effectively used as a "release" layer to transfer micro LEDs from wafer to glass backplanes.

In an embodiment, in order to achieve graphene on silicon growth, transfer-free graphene is produced using various carbon sources including amorphous carbon, polymers, self-assembled monolayers (SAMs), and implanted carbon. Among the various carbon sources, SAM may be very effective and promising since the amount of carbon introduced can be easily controlled.

Figure 4:
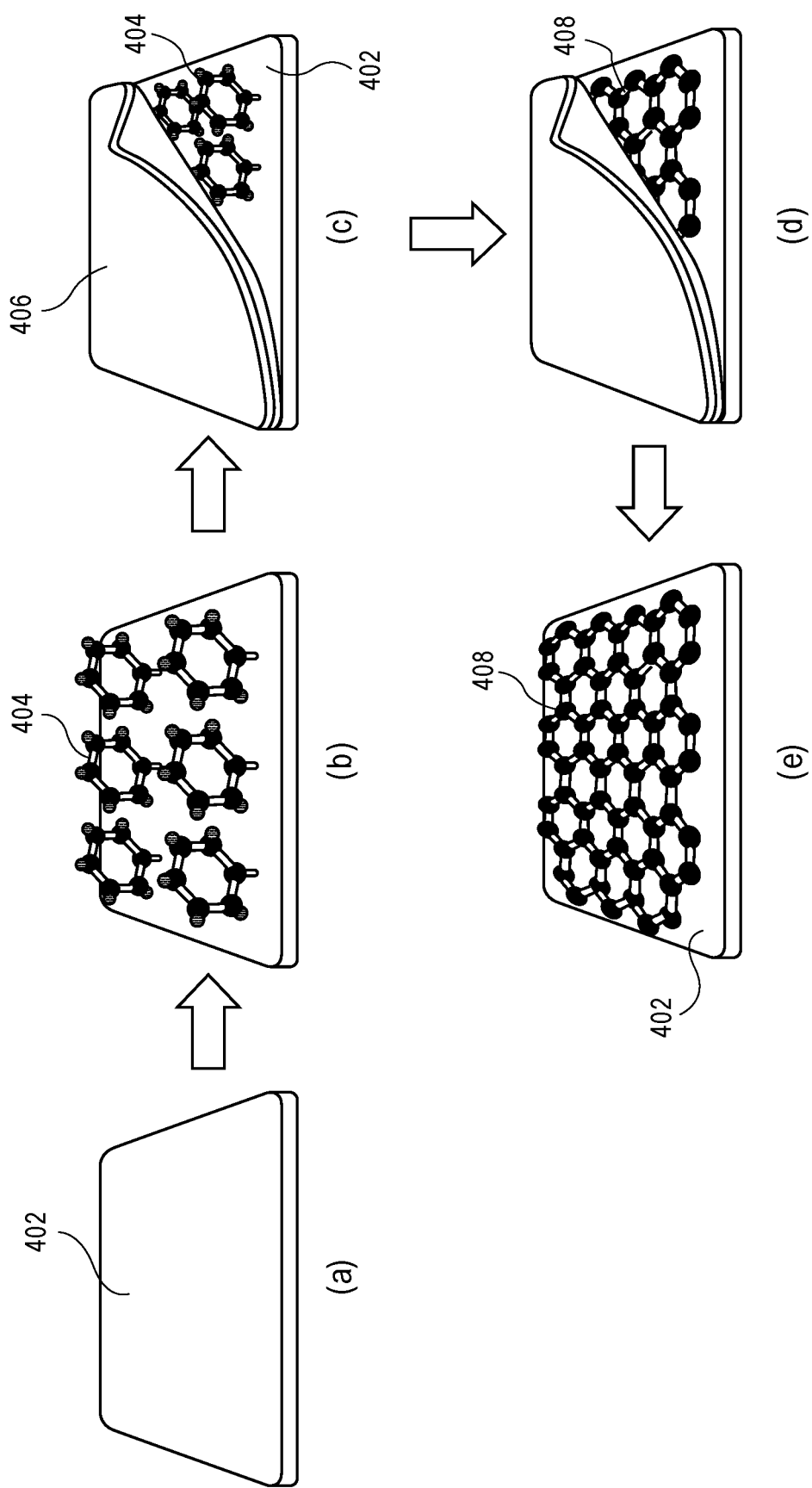
FIG. 4 is a schematic illustrating a graphene on silicon growth process, in accordance with an embodiment of the present disclosure.

FIG. 4 is a schematic illustrating a graphene on silicon growth process, in accordance with an embodiment of the present disclosure. Referring to FIG. 4, in part (a), a target substrate 402, such as a (001) Si substrate, is provided. In part (b), a self-assembled monolayer (SAM) 404, such as a phenyl-SAM coating, is applied to the surface of target substrate 402. In part (c), copper (Cu) thin film evaporation provides a copper layer 406 on the on SAM-coated substrate. In part (d), graphene 408 growth between the Cu layer 406 and the target substrate 402 is performed by thermal annealing. In part (e), the Cu layer 406 is selectively removed.

In a particular embodiment, with reference again to FIG. 4, target substrate 403 is first thoroughly cleaned using acetone/isopropyl alcohol and piranha solutions (1:3 mixture of hydrogen peroxide and sulfuric acid). The cleaned substrates are then immersed in 0.1 M trimethoxy phenyl-silane solution in hexane overnight followed by thermal annealing at 120° C. for 20 min for preparing the phenyl-SAM/substrate structure. Cu (200 nm) or Ni films (300 nm) are then deposited on top of the SAM using an electron-beam evaporator. The prepared samples are loaded in a low vacuum furnace (600-1000° C.) to form a Cu/graphene/substrate structure. Finally, the Cu films are wet-etched using 1 wt. % ammonium persulfate to provide the structure of part (e) of FIG. 4.

In an embodiment, the structure of part (e) of FIG. 4 is used for GaN growth thereon. It is to be appreciated that GaN may preferentially nucleate at multi-layer graphene ridges. The effect of graphene thickness, step-edge, and defect density may be used to determine the optimal graphene growth conditions for the nucleation of c-axis oriented, wurtzite GaN nuclei. Growth of coalesced GaN films on graphene layers can be performed such that the graphene buffer layer is used to affect the stress state of the GaN film.

In an exemplary process flow for fabricating GaN-on-Si (001) templates for fabricating GaN-based devices such as micro LEDs or RF transistors, the following operations are performed: (1) begin with a Si(001) wafer (e.g., 300 mm diameter), (2) clean (wet or dry) the wafer, (3) deposit an amorphous carbon layer (e.g., 5 nm), (4) deposit a Cu or Ni layer (e.g., 300 nm), (5) rapid thermal annealing to form $Ni_3C$ and drive Ni to the silicon/Ni interface to form single layer graphene (temperature approximately 1050° C.), (6) remove $Ni_3C$ layer to leave graphene on Si(001) (wet etch or thermal ablation), (7) functionalize graphene by hydrazine annealing (important for growth of high quality GaN in next step; diluted hydrazine for safety, T<600° C.), (8) deposit AlN using PVD (T<750° C.), (9) grow GaN seed layer using MOCVD (e.g. 200 nm-2000 nm), and (10) fabricate GaN devices (LEDs, transistors, etc.).

In an exemplary process flow for fabricating nanowire LEDs, the following operations are performed: (1) begin with a Si(001) wafer (e.g., 300 mm diameter), (2) clean (wet or dry) the wafer, (3) deposit an amorphous carbon layer (e.g., 5 nm), (4) deposit a Cu or Ni layer (e.g., 300 nm), (5) rapid thermal annealing to form $Ni_3C$ and drive Ni to the silicon/Ni interface to form single layer graphene (temperature approximately 1050° C.), (6) remove $Ni_3C$ layer to leave graphene on Si(001) (wet etch or thermal ablation), (7) functionalize graphene by hydrazine annealing (important for growth of high quality GaN in next step; diluted hydrazine for safety, T<600° C.), (8) deposit AlN using PVD (T less than 750° C.), (9) deposit $Si_3N_4$ mask layer (e.g., 100 nm-300 nm) (10) lithography and open less than 100 nm holes, and (11) grow N—GaN nanowires on graphene/AlN seed layer (height approximately 1000 nm-10000 nm).

In accordance with an embodiment of the present disclosure, functionalization of graphene is performed using hydrazine treatments of a graphene surface at relatively low temperature to enhance the interaction between GaN and graphene and to promote a low resistance interface for device operation. In an embodiment, a graphene layer is ablated by using femtosecond laser (infrared) through the Si wafer to separate/de-bond LED devices from the Si wafer such that the LED devices can be assembled on glass or plastic display backplanes to make micro LED displays. In an embodiment, a nanowire LEDs is fabricated on the substrate template including a layer of graphene. In an embodiment, a method to de-bond micro LEDs from a source wafer involves use of laser ablation of the graphene. In an embodiment, graphene remaining on the micro LED p-GaN results in improved contact resistance to an overlying p-GaN layer.

Figure 5A:
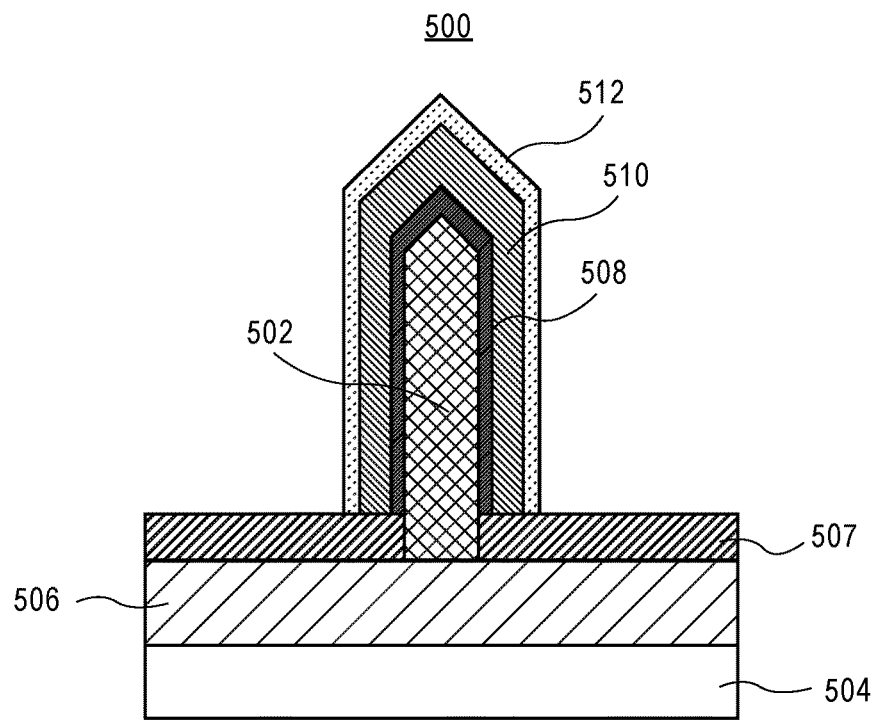
FIG. 5A illustrates a cross-sectional view of a GaN nanowire based LED highlighting certain layers of the LED, in accordance with an embodiment of the present disclosure.

FIG. 5A illustrates a cross-sectional view of a GaN nanowire based LED highlighting certain layers of the LED, in accordance with an embodiment of the present disclosure. In the exemplary embodiment of FIG. 5A, an LED 500 includes an n-type GaN nanowire 502 above a substrate 504, which may be a Si(001) substrate. An intervening graphene layer 506 has an opened mask layer 507 thereon. An active layer 508/510 (which may be a single active layer replacing 508/510) is included on the n-type GaN nanowire 502. In a particular embodiment, an $In_{0.2}Ga_{0.8}N$ shell "buffer" layer 508 is included on the n-type GaN nanowire 502, and an active $In_{0.4}Ga_{0.6}N$ layer 510 is included on the $In_{0.2}Ga_{0.8}N$ shell "buffer" layer 508. In one such embodiment, the $In_{0.4}Ga_{0.6}N$ layer 510 emits red color (e.g., having a wavelength in the range of 610-630 nanometers). A p-GaN or p-ZnO cladding layer 512 is included on the active layer 508/510.

In another such embodiment, following the fabrication of an ordered n-type $In_xGa_{1-x}N$ nanowire array with x in the range of 0.15-0.25, the remainder of the LED structure is grown radially around the nanowires. An $In_yGa_{1-y}N$ layer is on the $In_xGa_{1-x}N$ nanowires (and may be included in a set of $In_yGa_{1-y}N$/GaN multi-quantum well (MQW) active layers) with y in the range of 0.4-0.45. An undoped GaN layer and/or AlGaN electron blocking layer may be included as the next outer layer. Finally, a p-type GaN (or p-type ZnO) cladding layer may be included.

Figure 5B:
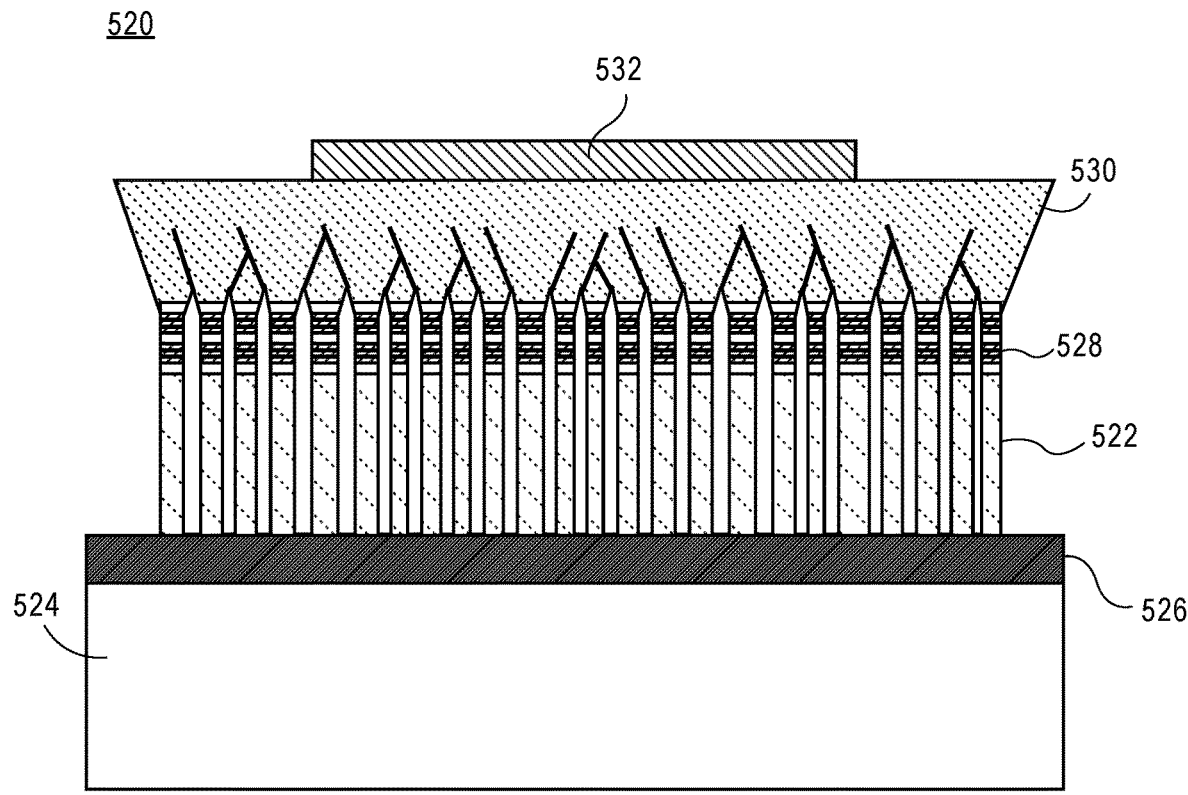
FIG. 5B illustrates a cross-sectional view of a micro-LED composed of multiple nanowire LEDs, in accordance with an embodiment of the present disclosure.

FIG. 5B illustrates a cross-sectional view of a micro-LED composed of multiple nanowire LEDs, in accordance with an embodiment of the present disclosure. In the exemplary embodiment of FIG. 5B, a micro-LED 520 includes an n-GaN nano-column 522 above a substrate 524, which may be a Si(001) substrate. An intervening graphene layer 526 is included between the n-GaN nano-column 522 and the substrate 524. An InGaN/GaN multi-quantum well device (MQD) stack 528 is included on the n-GaN nano-column 522. A p-GaN layer 530 is on the multi-quantum well device (MQD) stack 528. A transparent p-electrode 532 is included on the p-GaN layer 530.

It is to be appreciated that foundational geometries other than the above described nanowires may be used for LED fabrication. For example, in another embodiment, FIG. 5C illustrates a cross-sectional view of a GaN nanopyramid or micropyramid based LED highlighting certain layers of the LED, in accordance with an embodiment of the present disclosure. In the exemplary embodiment of FIG. 5C, an LED 540 includes an n-GaN nanopyramid 542 above a substrate 544, which may be a Si(001) substrate. An intervening graphene layer 546 has an opened mask layer 547 thereon. An InGaN layer 548 is included on the GaN nanopyramid 542. A p-GaN or p-ZnO cladding layer 552 is included on the InGaN layer 548. It is to be appreciated that a micro LED may be composed of multiple nanopyramids connected in parallel. For example, a 5 um×5 um micro LED may be composed of 20 nanopyramids.

In another embodiment, FIG. 5D illustrates a cross-sectional view of a GaN axial nanowire based LED highlighting certain layers of the LED, in accordance with an embodiment of the present disclosure. In the exemplary embodiment of FIG. 5D, an LED 560 includes an n-GaN axial nanowire 562 above a substrate 564, which may be a Si(001) substrate. An intervening graphene layer 566 has an opened mask layer 567 thereon. An InGaN layer 568 is included on the GaN axial nanowire 562. A p-GaN or p-ZnO cladding layer 572 is included on the InGaN layer 568.

FIGS. 6A-6C, 6D(1), 6D(2) and 6E illustrate cross-sectional views of a method of transferring pixel elements or RGB chips from a wafer to a display backplane, in accordance with an embodiment of the present disclosure.

Figure 6A:
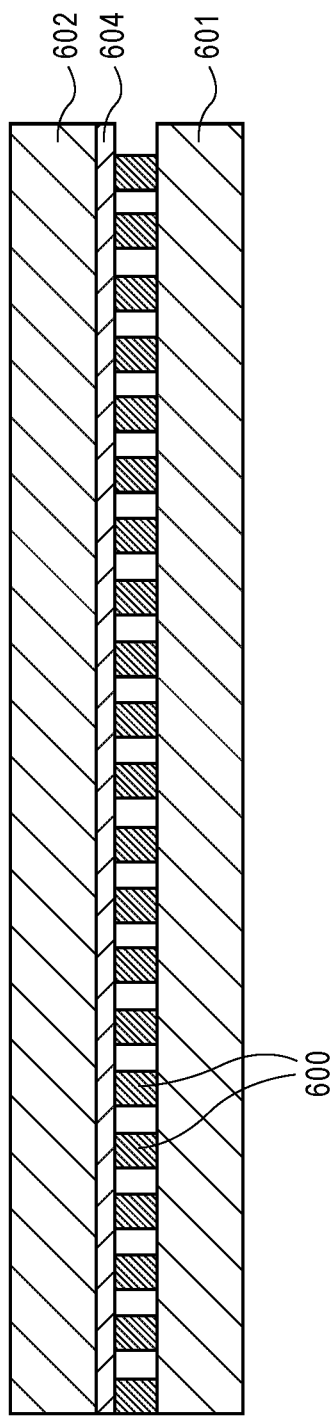
FIGS. 6A-6C, 6D(1), 6D(2) and 6E illustrate cross-sectional views of a method of transferring pixel elements or RGB chips from a wafer to a display backplane, in accordance with an embodiment of the present disclosure.
Figure 6B:
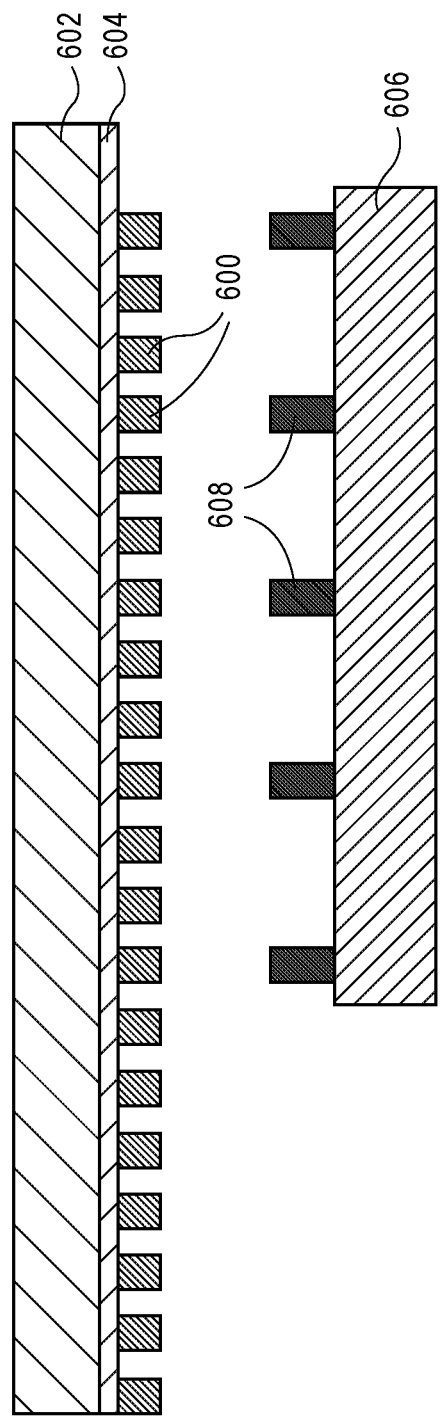

Referring to FIG. 6A, all micro LEDs 600 are attached to a graphene layer 604 on a wafer 602 (such as a (001) silicon wafer). A protective layer 601 may be included for transport into a transfer process. The wafer 602 is then aligned to a display backplane 606, e.g., aligned to metal bumps 608 of the display backplane 606, as is depicted in FIG. 6B. Referring to FIG. 6C, thermal compression bonding is performed for aligned micro LEDs 600 and metal bumps 608. In one embodiment, referring to FIG. 6D(1), the bonded micro LED chips 600 are detached from the wafer 602 using a mechanical force.

In another embodiment, referring to FIG. 6D(1) the bonded micro LED chips 600 are detached from the wafer 602 using IR light 620 passed through a mask 622 that is aligned with display backplane bump 608 pattern. In such an embodiment, selective release of micro LEDs is achieved by laser ablation of the graphene nucleation layer. Silicon is transparent to infrared laser irradiation. In an embodiment, graphene 604' remains on the top of the micro LED, as is depicted.

Figure 6E:
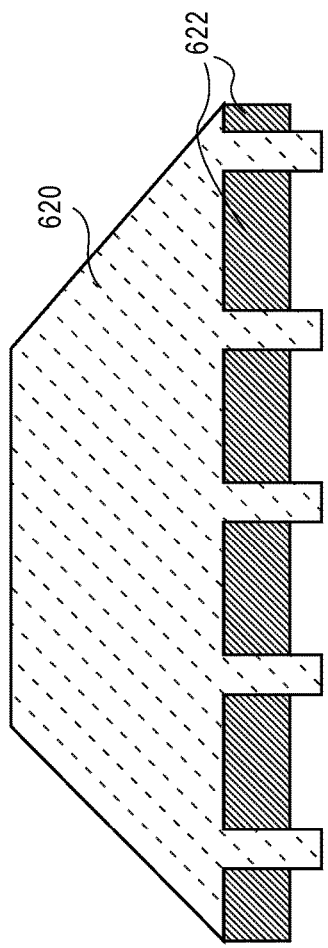
Figure 6E:
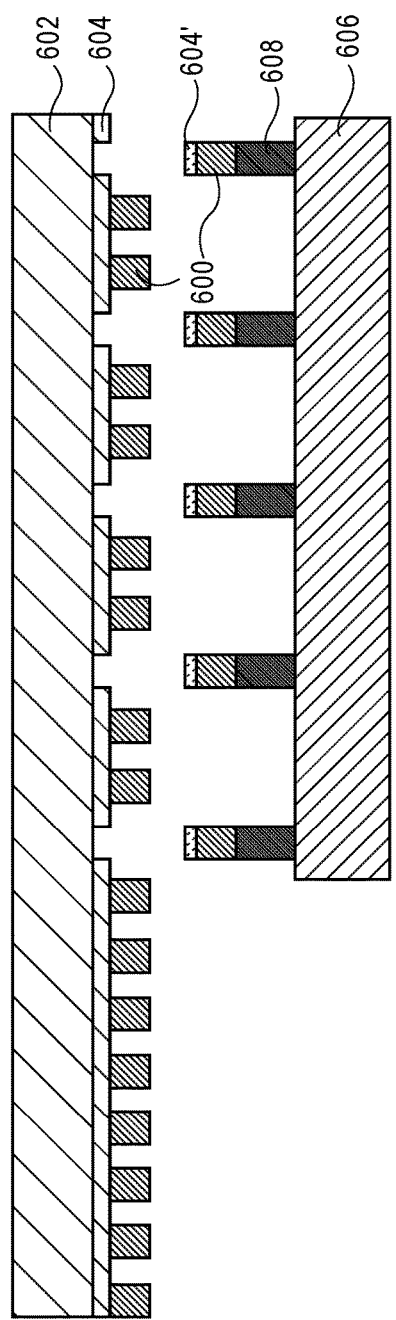
Figure 6E:
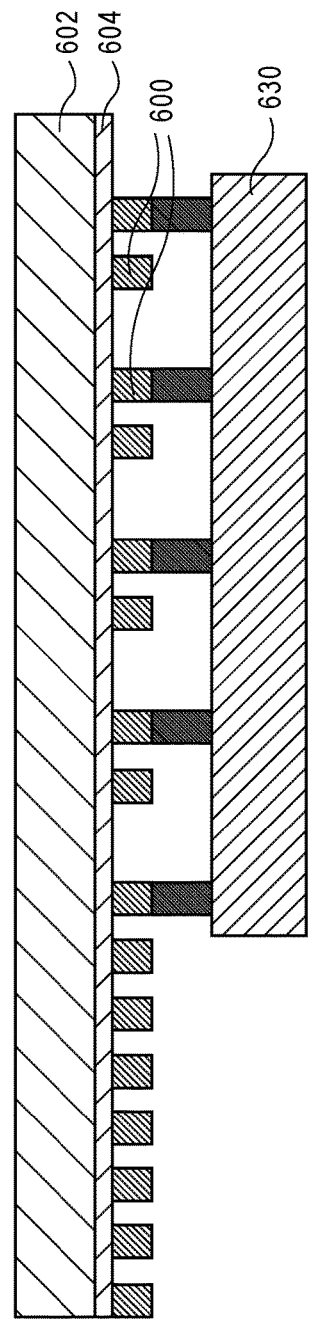

In an embodiment, referring to FIG. 6E, either following the mechanical detach or the IR detach, the remaining micro LED chips 600 are aligned to a new display backplane 630. The process may then be repeated once again.

In an embodiment, the thermal compression bonding is performed at a temperature in the range of 25° C. to 430° C., and at a pressure in the range of 1-2 MPa. In a specific embodiment of the approach described above, source wafers that have RGB pixels (chips) are provided. Wafer-to-wafer bonding equipment and process technologies are implemented to directly transfer micro LEDs from the source wafer to a target display backplane substrate.

Figure 7:
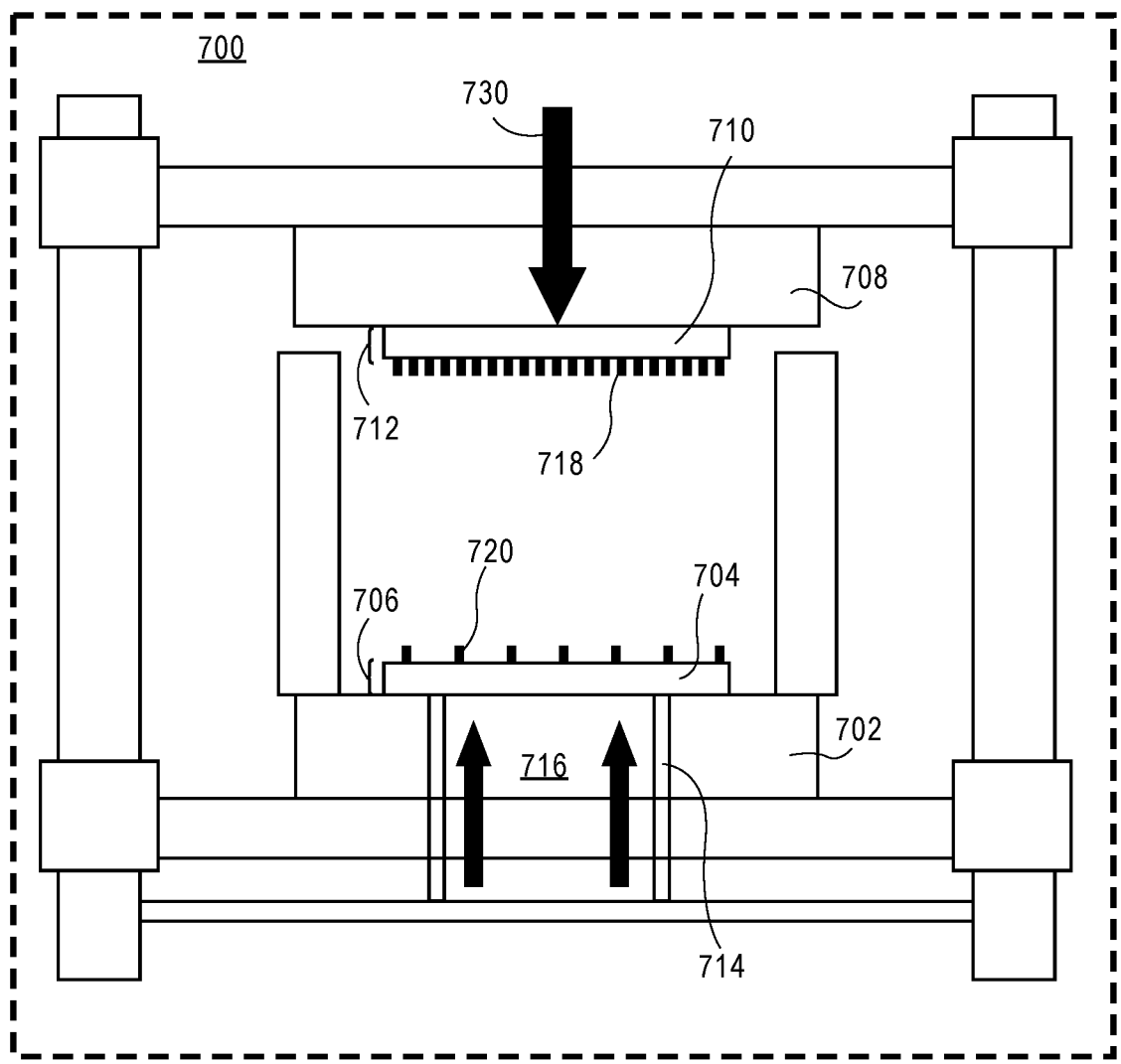
FIG. 7 illustrates a cross-sectional view of a schematic of a display bonder apparatus, in accordance with an embodiment of the present disclosure.

In an example, FIG. 7 illustrates a cross-sectional view of a schematic of a display bonder apparatus, in accordance with an embodiment of the present disclosure.

Referring to FIG. 7, a display bonder apparatus 700 includes a first support 702 for holding a display backplane substrate 704 in a first position 706. A second support 708 is for holding a silicon wafer 710 in a second position 712. The second position 712 is over the first position 706. In one embodiment, a piston 714 is coupled to the first support 702. The piston 714 is for moving the display backplane substrate 704 from the first position 706 toward the second position 712. Further, the piston 714 applies a force 716 to the display backplane substrate 704 to bond light-emitting diode (LED) pixel elements 718 on the silicon wafer 710 to metal bumps 720 on the display backplane substrate 704. In an embodiment, the display bonder apparatus further includes an infra-red irradiation source 730 coupled to the second support 708.

In an embodiment, the display bonder apparatus 700 is used in a transfer process where a micro LED source wafer is brought into contact with a display substrate having metal bumps, such that the micro LED metal contacts and backplane metal bumps are opposite to one another. The bonding process involves orienting the two substrates (source wafer and display substrate) parallel to one another and compressing the two substrates together by applying force 716 on the outer surface of the display substrate. The force 716 may be applied to the center of the display substrate with a piston-type mechanism. The bonder apparatus 700 may provide precise bonding and may be suitable for bonding one substrate pair at a time. The bonding apparatus may be provided with a vacuum chamber (or any controlled atmosphere) and an aligner. The substrates may be aligned in the aligner, loaded in the controlled atmospheric chamber (vacuum/other), and thereafter bonded to each other.

In a third aspect, in accordance with an embodiment of the present disclosure, micro LED displays are fabricated on large silicon wafers. The ability to scale wafer size to 300 mm Si(100) may enable low cost micro LED displays. Displays fabricated from micro LEDs composed of InGaN/GaN materials often require very tight uniformity of emitted wavelength (color) across 300 mm wafers.

To provide context, Si substrates are available in large sizes at low cost and high quality, and therefore provide a possible low-cost manufacturing route for GaN-based optoelectronic devices such as LEDs. This also offers the advantages of compatibility with standard Si processing equipment, the possibility of vertically contacted LEDs fabricated on conducting Si and the potential integration of electronic and optical devices. However, the large lattice mismatch (17%) between Si and GaN results in a high dislocation density in epitaxial GaN, limiting the performance of LED structures. Moreover, a tensile stress is introduced into the film upon cooling from growth temperature because of the large thermal expansion mismatch (46%) between Si and GaN. This can cause wafer bowing and/or cracks, making processing difficult and impairing device performance. As the substrate size is scaled up, the requirement of wafer flatness becomes stricter.

To provide further context, the addition of a buffer layer between the substrate (e.g. Si) and the nitride (device) layer reduces the number of defects. A thicker buffer layer provides higher device quality than a thinner buffer layer. An as supplied Si substrate is first annealed in the reactor to remove the native oxide layer, followed by the growth of an AlN nucleation layer, which also prevents Ga from reacting with the Si substrate that can cause meltback etching. Then, a crack-free GaN may be grown on AlN. However, a major source of wavelength non-uniformity is the variation of indium content in InGaN/GaN multi quantum wells used for fabricating micro LEDs. The root cause of such indium non-uniformity is non-uniformity in epitaxial growth temperatures at different locations on the wafers. Temperature non-uniformity within a wafer is mostly due to non-uniform contact of the wafer to the "susceptor" of the epitaxy reactor due to wafer bow resulting from earlier process steps such as the growth of an AlN nucleation layer on the silicon wafer. When AlN is grown at greater than 1100° C. on silicon a tensile stress is introduced into the film upon cooling from growth temperature because of the large thermal expansion mismatch (45%) between Si and AlN. This stress can cause wafer bowing.

In accordance with one or more embodiments of the present disclosure, a low temperature process is used to grow a nucleation layer. In one embodiment, implementation of such a process enables the manufacturing of micro LEDs on 12 inch (300 mm) silicon wafers. Advantages for implementing such embodiments of the present disclosure may include, but are not limited to low wafer bow, high wafer yield, and providing a path for fabricating low cost micro LED displays.

In an embodiment, low temperature (e.g., temperatures at or below 750 degrees Celsius) epitaxial growth of an aluminum nitride (AlN) nucleation layer is achieved using hydrazine ($N_2H_4$) as a source of nitrogen, as opposed to, e.g., ammonia. In a particular such embodiment, trimethylaluminum (TMA; $Al_2(CH_3)_5$)) is used as a source of aluminum. In an embodiment, such a relatively low temperature reaction between hydrazine and TMA to form an AlN nucleation layer results in minimized wafer bow on up to 12 inch (300 mm) silicon substrates. Highly uniform emission wavelength may thus be achieved for micro LEDs manufactured on large size silicon wafers.

In accordance with one or more embodiments of the present disclosure, an AlN nucleation layer formed using hydrazine is used in place of layers 102/104 in FIG. 1, in place of the graphene layers described in association with FIGS. 5A-5D, or in place of the graphene layers described in association with FIGS. 6A, 6B, 6C, 6D(1), 6D(2) and 6E. In accordance with one or more embodiments of the present disclosure, an AlN nucleation layer formed using hydrazine is used as an intervening layer between the silicon substrate and the graphene layers described in association with FIGS. 5A-5D, or as an intervening layer between the silicon substrate and the graphene layers described in association with FIGS. 6A, 6B, 6C, 6D(1), 6D(2) and 6E. In an embodiment, the silicon substrate is a (001) oriented substrate. In another embodiment, the silicon substrate is a (111) oriented substrate.

Figure 8:
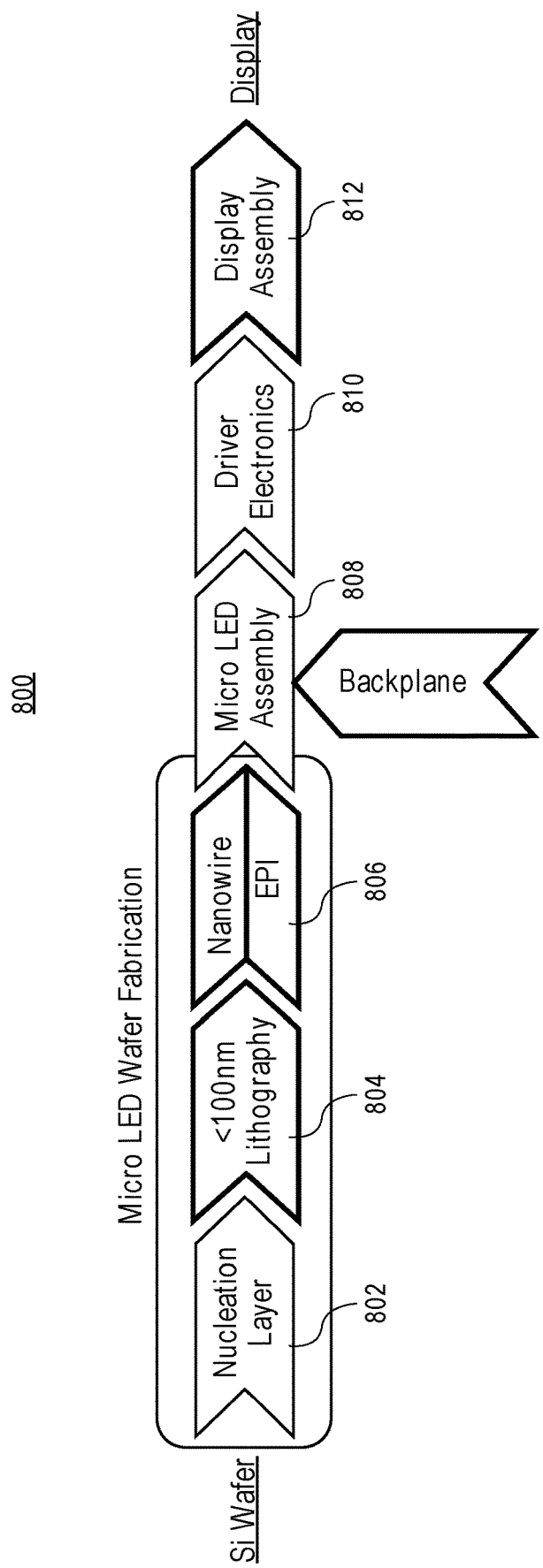
FIG. 8 is a flow diagram illustrating an RGB display production process, in accordance with an embodiment of the present disclosure.

In another aspect, FIG. 8 is a flow diagram 800 illustrating an RGB display production process, in accordance with an embodiment of the present disclosure. Referring to flow diagram 800, at operation 802, an Si wafer has a nucleation layer formed thereon, such as a patterned conductive/dielectric nucleation layer, a graphene nucleation layer or a graphene/AlN nucleation layer. At operation 804, sub 100 nm lithography is used to pattern a layer on the nucleation layer, or to pattern the nucleation layer. At operation 806, nanowire growth is performed on the nucleation layer, e.g., by epitaxial deposition. At operation 808, a backplane is introduced into the micro LED assembly process. At operation 810, driver electrons are fabricated. At operation 812, display assembly is performed to finally provide a display.

Figure 9:
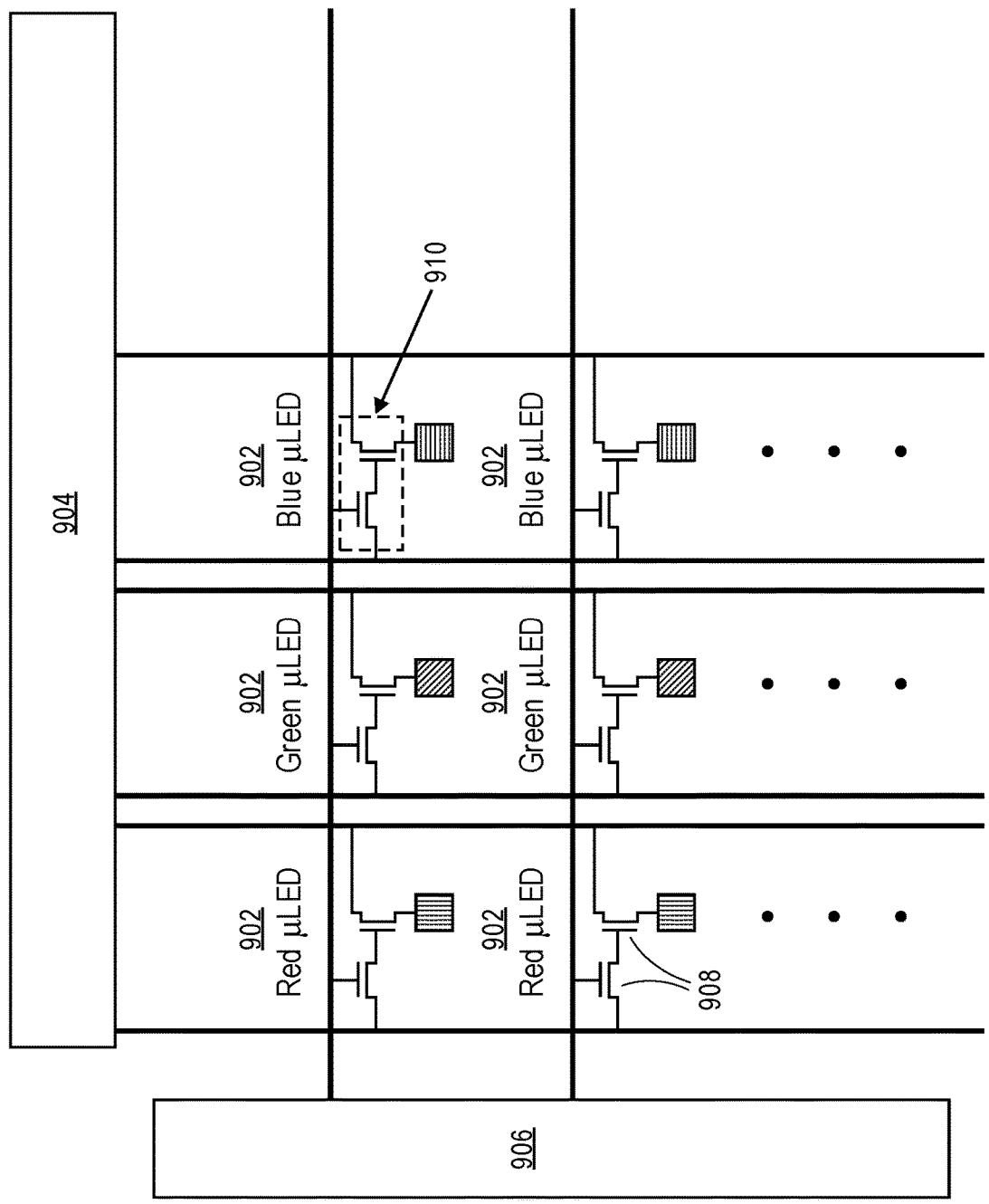
FIG. 9 is a schematic illustration of a display architecture, in accordance with an embodiment of the present disclosure.

FIG. 9 is a schematic illustration of a display architecture, in accordance with an embodiment of the present disclosure. Referring to FIG. 9, micro LEDs 902 are arranged in a matrix. The micro LEDs are driven through "Data Driver" 904 and "Scan Driver" 906 chips. Thin film transistors 908 are used to make "pixel driver circuits" 910 for each micro LED. In an embodiment, the micro LEDs are fabricated on a silicon wafer then transferred to a glass substrate called "backplane" where the "pixel driver circuits" 910 have been fabricated using thin film transistors.

Figure 10:
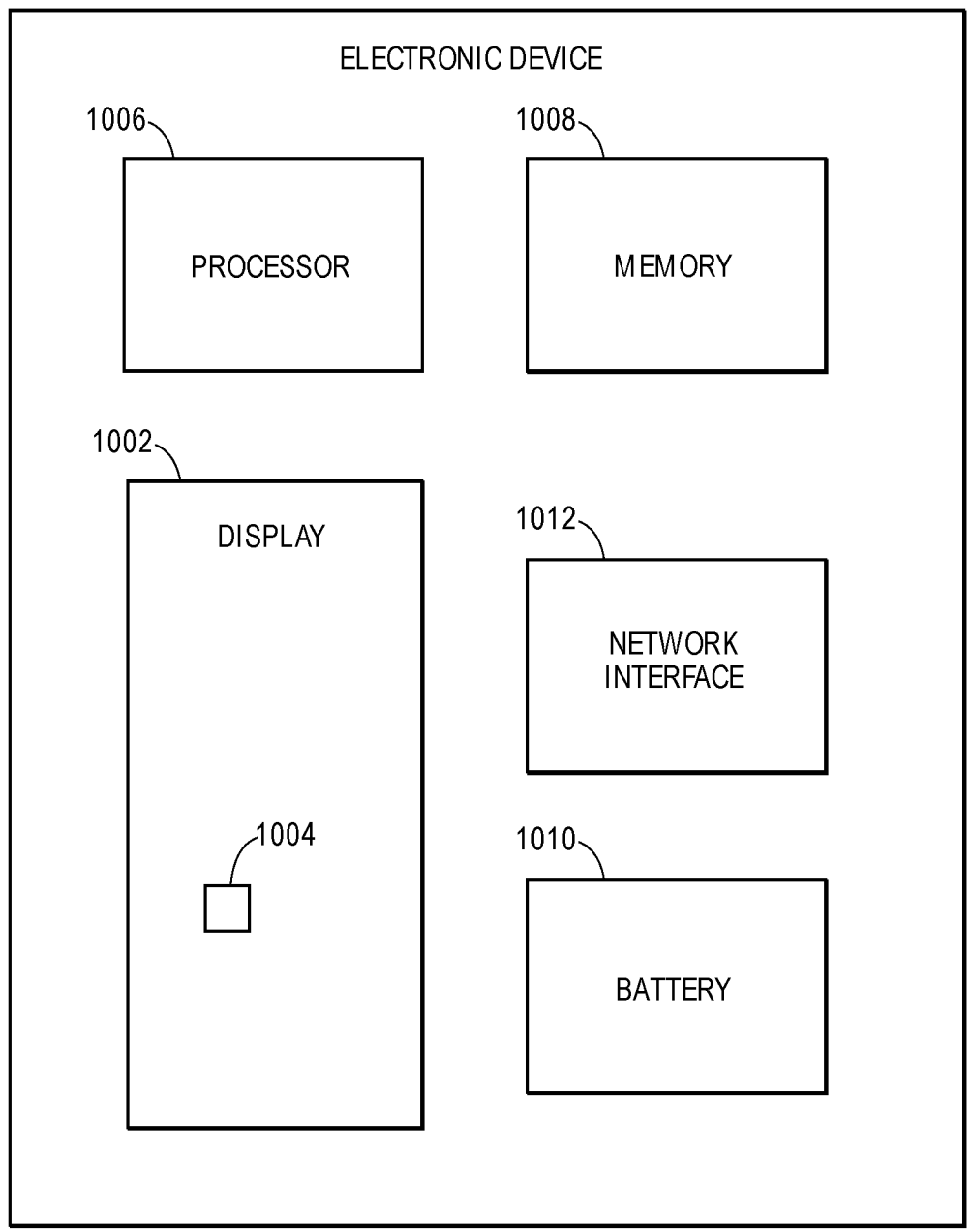
FIG. 10 is an electronic device having a display, in accordance with embodiments of the present disclosure.

FIG. 10 is an electronic device having a display, in accordance with embodiments of the present disclosure. Referring to FIG. 10, an electronic device 1000 has a display or display panel 1002 with a micro-structure 1004. The display may also have glass layers and other layers, circuitry, and so forth. The display panel 1002 may be a micro-LED display panel. As should be apparent, only one microstructure 1004 is depicted for clarity, though a display panel 1002 will have an array or arrays of microstructures including nanowire LEDs.

The electronic device 1000 may be a mobile device such as smartphone, tablet, notebook, smartwatch, and so forth. The electronic device 1000 may be a computing device, stand-alone display, television, display monitor, vehicle computer display, the like. Indeed, the electronic device 1000 may generally be any electronic device having a display or display panel.

The electronic device 1000 may include a processor 1006 (e.g., a central processing unit or CPU) and memory 1008. The memory 1008 may include volatile memory and non-volatile memory. The processor 1006 or other controller, along with executable code store in the memory 1008, may provide for touchscreen control of the display and well as for other features and actions of the electronic device 1000.

In addition, the electronic device 1000 may include a battery 1010 that powers the electronic device including the display panel 1002. The device 1000 may also include a network interface 1012 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 1000 may include additional components including circuitry and other components.

Thus, embodiments described herein include micro light-emitting diode (LED) fabrication and assembly.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A micro-light emitting diode (LED) display panel includes a display backplane substrate having a plurality of metal bumps thereon. A plurality of LED pixel elements includes ones of LED pixel elements bonded to corresponding ones of the plurality of metal bumps of display backplane substrate. One or more of the plurality of LED pixel elements has a graphene layer thereon. The graphene layer is on a side of the one or more of the plurality of LED pixel elements opposite the side of the metal bumps.

Example Embodiment 2

The micro-light emitting diode (LED) display panel of example embodiment 1, wherein the plurality of LED pixel elements is a plurality of nanowire-based LED pixel elements.

Example Embodiment 3

The micro-light emitting diode (LED) display panel of example embodiment 2, wherein the plurality of nanowire-based LED pixel elements includes GaN nanowires.

Example Embodiment 4

A method of manufacturing a micro-light emitting diode (LED) display panel includes positioning a silicon substrate above a display backplane substrate, the silicon substrate having a plurality of light-emitting diode (LED) pixel elements coupled to a patterned conductive region and dielectric region nucleation layer thereon, and the display backplane substrate having a plurality of metal bumps thereon. The method also includes aligning the silicon substrate with the display backplane substrate. The method also includes moving the display backplane substrate and the silicon substrate together to couple at least a portion of the plurality of LED pixel elements to corresponding ones of the plurality of metal bumps. The method also includes irradiating the patterned conductive region and dielectric region nucleation layer with an IR laser to transfer and bond the portion of the plurality of LED pixel elements to the corresponding ones of the plurality of metal bumps. The method also includes, subsequently, separating the silicon substrate from the display backplane substrate.

Example Embodiment 5

The method of example embodiment 4, wherein the plurality of LED pixel elements has a pitch on the silicon substrate less than a pitch of the plurality of metal bumps on the display backplane substrate.

Example Embodiment 6

The method of example embodiment 4 or 5, wherein the at least the portion of the plurality of LED pixel elements is a less than all of the plurality of LED pixel elements, the method further including positioning the silicon substrate above a second display backplane substrate, the silicon substrate having a remainder of the plurality of light-emitting diode (LED) pixel elements thereon; and transferring and bonding at least a portion of the remainder of the plurality of LED pixel elements to corresponding ones of a plurality of metal bumps of the second display backplane substrate.

Example Embodiment 7

The method of example embodiment 6, wherein the at least the portion of the remainder of the plurality of LED pixel elements is a less than all of the remainder of the plurality of LED pixel elements, the method further including positioning the silicon substrate above a third display backplane substrate, the silicon substrate having a second remainder of the plurality of light-emitting diode (LED) pixel elements thereon; and transferring and bonding at least a portion of the second remainder of the plurality of LED pixel elements to corresponding ones of a plurality of metal bumps of the third display backplane substrate.

Example Embodiment 8

The method of example embodiment 4, 5, 6 or 7, wherein the plurality of LED pixel elements is grown on the silicon substrate.

Example Embodiment 9

The method of example embodiment 4, 5, 6, 7 or 8, wherein the plurality of LED pixel elements is a plurality of nanowire-based LED pixel elements.

Example Embodiment 10

The method of example embodiment 9, wherein the plurality of nanowire-based LED pixel elements includes GaN nanowires.

Example Embodiment 11

A method of manufacturing a micro-light emitting diode (LED) display panel includes positioning a silicon substrate above a display backplane substrate, the silicon substrate having a plurality of light-emitting diode (LED) pixel elements coupled to a graphene nucleation layer thereon, and the display backplane substrate having a plurality of metal bumps thereon. The method also includes aligning the silicon substrate with the display backplane substrate. The method also includes moving the display backplane substrate and the silicon substrate together to couple at least a portion of the plurality of LED pixel elements to corresponding ones of the plurality of metal bumps. The method also includes irradiating the graphene nucleation layer with an IR laser to transfer and bond the portion of the plurality of LED pixel elements to the corresponding ones of the plurality of metal bumps. The method also includes, subsequently, separating the silicon substrate from the display backplane substrate.

Example Embodiment 12

The method of example embodiment 11, wherein the plurality of LED pixel elements has a pitch on the silicon substrate less than a pitch of the plurality of metal bumps on the display backplane substrate.

Example Embodiment 13

The method of example embodiment 11 or 12, wherein the at least the portion of the plurality of LED pixel elements is a less than all of the plurality of LED pixel elements, the method further including positioning the silicon substrate above a second display backplane substrate, the silicon substrate having a remainder of the plurality of light-emitting diode (LED) pixel elements thereon; and transferring and bonding at least a portion of the remainder of the plurality of LED pixel elements to corresponding ones of a plurality of metal bumps of the second display backplane substrate.

Example Embodiment 14

The method of example embodiment 13, wherein the at least the portion of the remainder of the plurality of LED pixel elements is a less than all of the remainder of the plurality of LED pixel elements, the method further including positioning the silicon substrate above a third display backplane substrate, the silicon substrate having a second remainder of the plurality of light-emitting diode (LED) pixel elements thereon; and transferring and bonding at least a portion of the second remainder of the plurality of LED pixel elements to corresponding ones of a plurality of metal bumps of the third display backplane substrate.

Example Embodiment 15

The method of example embodiment 11, 12, 13 or 14, wherein the plurality of LED pixel elements is grown on the silicon substrate.

Example Embodiment 16

The method of example embodiment 11, 12, 13, 14 or 15, wherein the plurality of LED pixel elements is a plurality of nanowire-based LED pixel elements.

Example Embodiment 17

The method of example embodiment 16, wherein the plurality of nanowire-based LED pixel elements includes GaN nanowires.

Example Embodiment 18

A method of manufacturing a micro-light emitting diode (LED) display panel includes positioning a silicon substrate above a display backplane substrate, the silicon substrate having a plurality of light-emitting diode (LED) pixel elements coupled to an AlN nucleation layer thereon, the AlN nucleation layer formed using hydrazine, and the display backplane substrate having a plurality of metal bumps thereon. The method also includes aligning the silicon substrate with the display backplane substrate. The method also includes moving the display backplane substrate and the silicon substrate together to couple at least a portion of the plurality of LED pixel elements to corresponding ones of the plurality of metal bumps. The method also includes irradiating the AlN nucleation layer with an IR laser to transfer and bond the portion of the plurality of LED pixel elements to the corresponding ones of the plurality of metal bumps. The method also includes, subsequently, separating the silicon substrate from the display backplane substrate.

Example Embodiment 19

The method of example embodiment 18, wherein the plurality of LED pixel elements has a pitch on the silicon substrate less than a pitch of the plurality of metal bumps on the display backplane substrate.

Example Embodiment 20

The method of example embodiment 18 or 19, wherein the at least the portion of the plurality of LED pixel elements is a less than all of the plurality of LED pixel elements, the method further including positioning the silicon substrate above a second display backplane substrate, the silicon substrate having a remainder of the plurality of light-emitting diode (LED) pixel elements thereon; and transferring and bonding at least a portion of the remainder of the plurality of LED pixel elements to corresponding ones of a plurality of metal bumps of the second display backplane substrate.

Example Embodiment 21

The method of example embodiment 20, wherein the at least the portion of the remainder of the plurality of LED pixel elements is a less than all of the remainder of the plurality of LED pixel elements, the method further including positioning the silicon substrate above a third display backplane substrate, the silicon substrate having a second remainder of the plurality of light-emitting diode (LED) pixel elements thereon; and transferring and bonding at least a portion of the second remainder of the plurality of LED pixel elements to corresponding ones of a plurality of metal bumps of the third display backplane substrate.

Example Embodiment 22

The method of example embodiment 18, 19, 20 or 21, wherein the plurality of LED pixel elements is grown on the silicon substrate.

Example Embodiment 23

The method of example embodiment 18, 19, 20, 21 or 22, wherein the plurality of LED pixel elements is a plurality of nanowire-based LED pixel elements.

Example Embodiment 24

The method of example embodiment 23, wherein the plurality of nanowire-based LED pixel elements includes GaN nanowires.

What is claimed is:

1. A method of manufacturing a micro-light emitting diode (LED) display panel, the method comprising:
    positioning a silicon substrate above a display backplane substrate, the silicon substrate having a plurality of light-emitting diode (LED) pixel elements coupled to a patterned conductive region and dielectric region nucleation layer thereon, and the display backplane substrate having a plurality of metal bumps thereon;
    aligning the silicon substrate with the display backplane substrate;
    moving the display backplane substrate and the silicon substrate together to couple at least a portion of the plurality of LED pixel elements to corresponding ones of the plurality of metal bumps;
    irradiating the patterned conductive region and dielectric region nucleation layer with an IR laser to transfer and bond the portion of the plurality of LED pixel elements to the corresponding ones of the plurality of metal bumps; and, subsequently,
    separating the silicon substrate from the display backplane substrate.

2. The method of claim 1, wherein the plurality of metal bumps on the display backplane substrate has a pitch that is an integer multiple of a pitch of the plurality of LED pixel elements on the silicon substrate.

3. The method of claim 1, wherein the at least the portion of the plurality of LED pixel elements is a less than all of the plurality of LED pixel elements, the method further comprising:
    positioning and aligning the silicon substrate above a second display backplane substrate, the silicon substrate having a remainder of the plurality of light-emitting diode (LED) pixel elements thereon, the aligning comprising moving one of the silicon substrate and the second display backplane substrate horizontally by a distance equal to an integer multiple of a pitch of the plurality of LED pixel elements on the silicon substrate; and
    transferring and bonding at least a portion of the remainder of the plurality of LED pixel elements to corresponding ones of a plurality of metal bumps of the second display backplane substrate.

4. The method of claim 3, wherein the at least the portion of the remainder of the plurality of LED pixel elements is a less than all of the remainder of the plurality of LED pixel elements, the method further comprising:
    positioning and aligning the silicon substrate above a third display backplane substrate, the silicon substrate having a second remainder of the plurality of light-emitting diode (LED) pixel elements thereon, the aligning comprising moving one of the silicon substrate and the second display backplane substrate horizontally by a distance equal to an integer multiple of a pitch of the plurality of LED pixel elements on the silicon substrate; and
    transferring and bonding at least a portion of the second remainder of the plurality of LED pixel elements to corresponding ones of a plurality of metal bumps of the third display backplane substrate.

5. The method of claim 1, wherein the plurality of LED pixel elements is grown on the silicon substrate.

6. The method of claim 1, wherein the plurality of LED pixel elements is a plurality of nanowire-based LED pixel elements.

7. The method of claim 6, wherein the plurality of nanowire-based LED pixel elements comprises GaN nanowires.

8. A method of manufacturing a micro-light emitting diode (LED) display panel, the method comprising:
    positioning a silicon substrate above a display backplane substrate, the silicon substrate having a plurality of light-emitting diode (LED) pixel elements coupled to a graphene nucleation layer thereon, and the display backplane substrate having a plurality of metal bumps thereon;
    aligning the silicon substrate with the display backplane substrate;
    moving the display backplane substrate and the silicon substrate together to couple at least a portion of the plurality of LED pixel elements to corresponding ones of the plurality of metal bumps;
    irradiating the graphene nucleation layer with an IR laser to transfer and bond the portion of the plurality of LED pixel elements to the corresponding ones of the plurality of metal bumps; and, subsequently,
    separating the silicon substrate from the display backplane substrate.

9. The method of claim 8, wherein the plurality of metal bumps on the display backplane substrate has a pitch that is an integer multiple of a pitch of the plurality of LED pixel elements on the silicon substrate.

10. The method of claim 8, wherein the at least the portion of the plurality of LED pixel elements is a less than all of the plurality of LED pixel elements, the method further comprising:
    positioning and aligning the silicon substrate above a second display backplane substrate, the silicon substrate having a remainder of the plurality of light-emitting diode (LED) pixel elements thereon, the aligning comprising moving one of the silicon substrate and the second display backplane substrate horizontally by a distance equal to an integer multiple of a pitch of the plurality of LED pixel elements on the silicon substrate; and
    transferring and bonding at least a portion of the remainder of the plurality of LED pixel elements to corresponding ones of a plurality of metal bumps of the second display backplane substrate.

11. The method of claim 10, wherein the at least the portion of the remainder of the plurality of LED pixel elements is a less than all of the remainder of the plurality of LED pixel elements, the method further comprising:
    positioning and aligning the silicon substrate above a third display backplane substrate, the silicon substrate having a second remainder of the plurality of light-emitting diode (LED) pixel elements thereon, the aligning comprising moving one of the silicon substrate and the second display backplane substrate horizontally by a distance equal to an integer multiple of a pitch of the plurality of LED pixel elements on the silicon substrate; and
    transferring and bonding at least a portion of the second remainder of the plurality of LED pixel elements to corresponding ones of a plurality of metal bumps of the third display backplane substrate.

12. The method of claim 8, wherein the plurality of LED pixel elements is grown on the silicon substrate.

13. The method of claim 8, wherein the plurality of LED pixel elements is a plurality of nanowire-based LED pixel elements.

14. The method of claim 13, wherein the plurality of nanowire-based LED pixel elements comprises GaN nanowires.

15. A method of manufacturing a micro-light emitting diode (LED) display panel, the method comprising:
positioning a silicon substrate above a display backplane substrate, the silicon substrate having a plurality of light-emitting diode (LED) pixel elements coupled to an AlN nucleation layer thereon, the AlN nucleation layer formed using hydrazine, and the display backplane substrate having a plurality of metal bumps thereon;
aligning the silicon substrate with the display backplane substrate;
moving the display backplane substrate and the silicon substrate together to couple at least a portion of the plurality of LED pixel elements to corresponding ones of the plurality of metal bumps;
irradiating the AlN nucleation layer with an IR laser to transfer and bond the portion of the plurality of LED pixel elements to the corresponding ones of the plurality of metal bumps; and, subsequently,
separating the silicon substrate from the display backplane substrate.

16. The method of claim 15, wherein the plurality of metal bumps on the display backplane substrate has a pitch that is an integer multiple of a pitch of the plurality of LED pixel elements on the silicon substrate.

17. The method of claim 15, wherein the at least the portion of the plurality of LED pixel elements is a less than all of the plurality of LED pixel elements, the method further comprising:
positioning and aligning the silicon substrate above a second display backplane substrate, the silicon substrate having a remainder of the plurality of light-emitting diode (LED) pixel elements thereon, the aligning comprising moving one of the silicon substrate and the second display backplane substrate horizontally by a distance equal to an integer multiple of a pitch of the plurality of LED pixel elements on the silicon substrate; and
transferring and bonding at least a portion of the remainder of the plurality of LED pixel elements to corresponding ones of a plurality of metal bumps of the second display backplane substrate.

18. The method of claim 17, wherein the at least the portion of the remainder of the plurality of LED pixel elements is a less than all of the remainder of the plurality of LED pixel elements, the method further comprising:
positioning and aligning the silicon substrate above a third display backplane substrate, the silicon substrate having a second remainder of the plurality of light-emitting diode (LED) pixel elements thereon, the aligning comprising moving one of the silicon substrate and the second display backplane substrate horizontally by a distance equal to an integer multiple of a pitch of the plurality of LED pixel elements on the silicon substrate; and
transferring and bonding at least a portion of the second remainder of the plurality of LED pixel elements to corresponding ones of a plurality of metal bumps of the third display backplane substrate.

19. The method of claim 15, wherein the plurality of LED pixel elements is grown on the silicon substrate.

20. The method of claim 15, wherein the plurality of LED pixel elements is a plurality of nanowire-based LED pixel elements.

21. The method of claim 20, wherein the plurality of nanowire-based LED pixel elements comprises GaN nanowires.

* * * * *